(12) United States Patent
Wang et al.

(10) Patent No.: US 12,154,621 B2
(45) Date of Patent: Nov. 26, 2024

(54) READ AND WRITE CIRCUIT OF THREE-DIMENSIONAL PHASE-CHANGE MEMORY

(71) Applicant: HUAZHONG UNIVERSITY OF SCIENCE AND TECHNOLOGY, Hubei (CN)

(72) Inventors: Xingsheng Wang, Hubei (CN); Fan Yang, Hubei (CN); Lingjun Zhou, Hubei (CN); Chengxu Wang, Hubei (CN); Xiangshui Miao, Hubei (CN)

(73) Assignee: HUAZHONG UNIVERSITY OF SCIENCE AND TECHNOLOGY, Hubei (CN)

( * ) Notice: Subject to any disclaimer, the term of this patent is extended or adjusted under 35 U.S.C. 154(b) by 248 days.

(21) Appl. No.: 17/873,186

(22) Filed: Jul. 26, 2022

(65) Prior Publication Data

US 2022/0383951 A1 Dec. 1, 2022

(30) Foreign Application Priority Data

May 26, 2021 (CN) .......................... 202110575670.6

(51) Int. Cl.
*G11C 13/00* (2006.01)

(52) U.S. Cl.
CPC ...... *G11C 13/0004* (2013.01); *G11C 13/0038* (2013.01); *G11C 13/004* (2013.01); *G11C 13/0069* (2013.01); *G11C 2013/0054* (2013.01)

(58) Field of Classification Search
CPC ............ G11C 13/0004; G11C 13/0038; G11C 13/004; G11C 13/0069; G11C 2013/0054
USPC ........................................................ 365/148
See application file for complete search history.

(56) References Cited

U.S. PATENT DOCUMENTS

2004/0136255 A1* 7/2004 Crain ...................... G11C 7/062
                                                         365/208

* cited by examiner

*Primary Examiner* — Huan Hoang
*Assistant Examiner* — Daniel J King
(74) *Attorney, Agent, or Firm* — JCIPRNET (57) ABSTRACT

A read and write circuit of a three-dimensional phase-change memory including an operation control circuit and a read and write operation circuit connected to each other. The operation control circuit is configured to load a correct operation pulse onto the read and write operation circuit. A read and write unit in the read and write operation circuit is connected to a memory cell and is configured to load the correct operation pulse onto the memory cell corresponding to the three-dimensional phase-change memory and to mirror the correct operation pulse to a mirror current. A bandgap reference source and a hysteresis comparator are connected to a mirror circuit branch. A feedback chopper circuit loop is connected across the memory cell and the mirror circuit branch and is configured to monitor a current flowing through the memory cell in real time.

13 Claims, 6 Drawing Sheets

READ AND WRITE CIRCUIT OF THREE-DIMENSIONAL PHASE-CHANGE MEMORY

CROSS-REFERENCE TO RELATED APPLICATION

This application claims the priority benefit of China application No. 202110575670.6, filed on May 26, 2021. The entirety of the above-mentioned patent application is hereby incorporated by reference herein and made a part of this specification.

BACKGROUND

Technical Field

The disclosure belongs to the technical field of microelectronics, and in particular, relates to a read and write circuit of a three-dimensional phase-change memory.

Description of Related Art

Phase-change materials were first proposed by Ovshinsky in 1968. Phase-change materials generally have two states, crystalline and amorphous. At shrinking process nodes, the use of three-dimensional stacked memory cells can reduce the effective unit area, and the storage density may thus be significantly increased. One of the highlights of the phase-change memory is that the phase-change memory can be three-dimensionally integrated. However, after the three-dimensional stacking is performed for the phase-change memory cells, a huge leakage current is inevitably generated during the operation process. The strobe technology effectively solves the leakage current problem. In the related art, a two-terminal strobe device-ovonic threshold switch (OTS) is used to vertically integrate with a memory cell to form a 1S1R structure. The leakage current of the unselected unit is effectively suppressed by the high resistance state of the strobe device, and the power consumption during operation is reduced as well. Combining the properties of OTS and PCM, in the commonly used operation method, a given voltage is applied to both ends of the OTS+PCM, the strobe device is turned on, and the corresponding PCM is operated.

Figure 1:
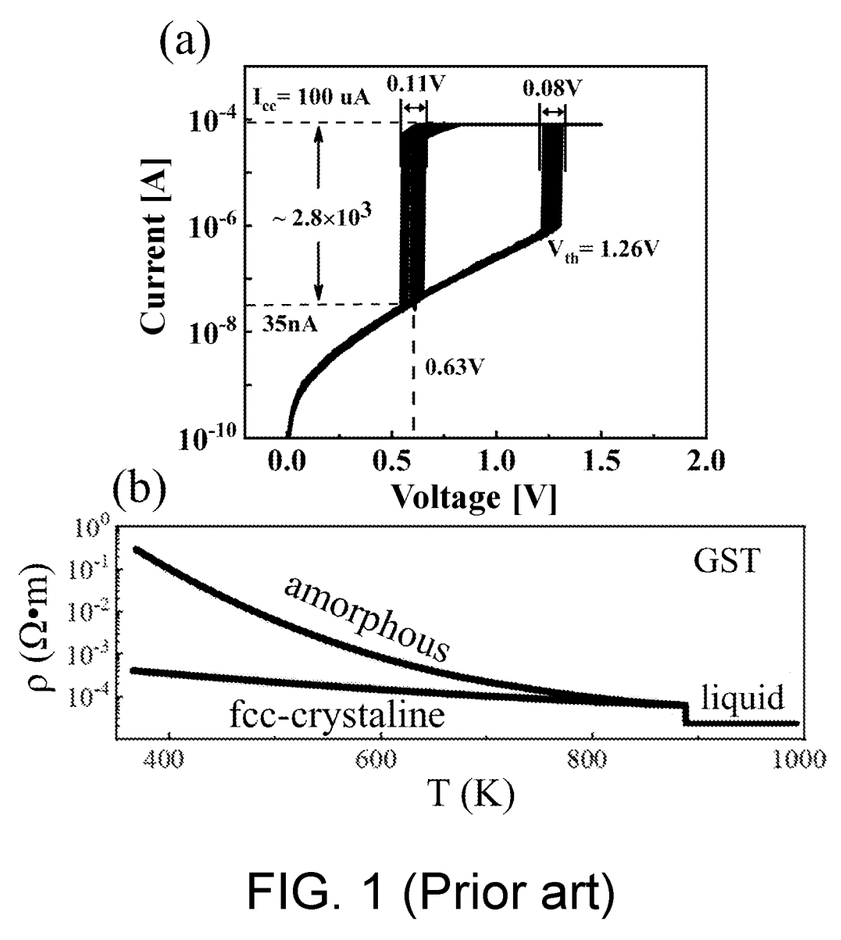
FIG. 1 is a characteristic simulation diagram of a phase-change memory in an embodiment of the disclosure.

As shown in (b) in FIG. 1, in the curve of the resistivity of the crystalline and amorphous states of PCM changing with temperature, it can be seen that as the temperature rises until it reaches the molten state, the resistivity of the amorphous state gradually decreases until it is the same as the crystalline state. During the set process, the PCM changes from an amorphous state to a crystalline state. When the phase-change unit temperature is above the crystallization temperature and below the melting temperature Tm, the cell starts to crystallize. As the crystallization ratio begins to gradually increase, the unit resistance decreases accordingly. Further, in (b) in FIG. 2, it can be concluded that the crystallization rate is the fastest when the temperature is 700K. In this process, the voltage pulse causes the resistance to reduce. The reduction in resistance increases power consumption, and the temperature rises sharply in a short period of time, which in turn increases the rate of crystallization, resulting in lower resistance. The whole process presents a positive feedback loop. But there is another problem in this process. Because the temperature rises too fast, the voltage pulse is not removed in time, so the temperature quickly rises above the melting temperature Tm, and the phase-change unit appears in a molten state. After cooling, the molten state is quenched into an amorphous state, and the phase-change unit appears mostly amorphous, resulting in an increase in resistance and set failure. This is the problem of set process, the resistance of PCM cannot convert from high resistance to low resistance, which is common in voltage pulse operation.

Similarly, it can also be inferred from (b) in FIG. 1 that the reset process also faces the same problem. During the reset process, when the temperature rises above the melting temperature Tm, the phase-change unit appears in a molten state, and the resistivity of the molten state is lower than the static resistivity, resulting in an increase in the current flowing through the phase-change unit as well as an increase in power consumption and temperature. Therefore, the molten state appears in a large area, the resistance of the phase-change unit is lower, and the entire process presents a positive feedback loop, which leads to a sharp rise in temperature in a short time, and problems such as excessive amorphization, thermal breakdown, and thermal crosstalk occur. This is the problem brought about by the voltage pulse in the reset process.

SUMMARY

The disclosure provides a read and write circuit of a three-dimensional phase-change memory, which aims to pull the voltage loaded on a memory cell to a ground (GND) through a feedback chopper circuit loop, so that the temperature on the memory cell cannot be accumulated in a short time.

To achieve the above, the disclosure provides a read and write circuit of a three-dimensional phase-change memory including an operation control circuit and a read and write operation circuit connected to each other.

The operation control circuit is configured to load a correct operation pulse onto the read and write operation circuit according to a read and write sequence operation requirement.

The read and write operation circuit includes a read and write unit, a bandgap reference source, a hysteresis comparator, and a feedback chopper circuit loop.

The read and write unit is connected to a memory cell and is configured to load the correct operation pulse onto the memory cell to operate the memory cell and to mirror the correct operation pulse to a mirror current branch to obtain a mirror current.

The bandgap reference source and the hysteresis comparator are connected to the mirror circuit branch, such that when a voltage obtained by the mirror current through a reference resistor is greater than a reference voltage in the bandgap reference source, the output of the hysteresis comparator is a high level, otherwise it is a low level to represent a resistance state of the memory cell.

The feedback chopper circuit loop is connected across the memory cell and the mirror circuit branch and is configured to monitor a current flowing through the memory cell in the mirror circuit branch in real time. When the current is greater than a current threshold, the memory cell is controlled to reduce the voltage, so that the temperature thereof cannot be accumulated for a short time, and thermal breakdown, unsuccessful set operation, and thermal crosstalk are prevented from occurring.

In an embodiment, the memory cell includes a three-dimensional phase-change memory (PCM) and an ovonic threshold switch (OTS) strobe device connected in series.

In an embodiment, the feedback chopper circuit loop is further configured to feed back a sampling voltage obtained by the mirror current through a sampling resistor onto a feedback transistor. If the sampling voltage is excessively large, the feedback transistor is turned on to pull the voltage of the correct operation pulse on the memory cell to GND to cut off the voltage of the correct operation pulse, so that the temperature cannot be accumulated in a short time.

In an embodiment, the feedback transistor is an NMOS transistor and is connected in parallel with the memory cell. A gate of the NMOS transistor is connected to a resistor sampling terminal of the mirror current, such that the NMOS transistor is turned on and works in a linear resistance region when a sampled voltage is greater than a predetermined value. The NMOS transistor is regarded as an on-resistance far lower than the resistance of the memory cell to achieve current shunting. The amplitude of an operating voltage pulse to GND to chop a pulse waveform.

In an embodiment, the read and write unit is configured to perform reset, set, and read operations on the memory cell and output memory cell information after successful operation to an external data buffer through the comparator.

In an embodiment, the read and write operation circuit of the three-dimensional phase-change memory further includes a pulse generation and control circuit.

The pulse generation and control circuit is connected to the operation control circuit and is configured to convert externally-inputted operation signals with different pulse widths by performing level shift conversion to obtain the correct operation pulse and input the correct operation pulse to the operation control circuit.

In an embodiment, the correct operation pulse is converted into voltage pulses of different amplitudes to 1.5 Volt (V), 2V, and 3V.

DESCRIPTION OF THE EMBODIMENTS

In order to make the objectives, technical solutions, and advantages of the disclosure clearer and more comprehensible, the disclosure is further described in detail with reference to the drawings and embodiments. It should be understood that the specific embodiments described herein serve to explain the disclosure merely and are not used to limit the disclosure. In addition, the technical features involved in the various embodiments of the disclosure described below can be combined with each other as long as the technical features do not conflict with each other.

(a) in FIG. 1 is an ovonic threshold switch (OTS) voltage scan diagram, and it can be seen that the threshold voltage Vth of the OTS is 1.26V. By selecting the voltage pulses of 1.5 Volt (V), 2V, and 3V, the OTS may be turned on to perform read and write operations on a phase-change memory (PCM) cell. When the PCM cell is operated in voltage, it goes through a cycle to cycle variation problem of many operation cycles, and the voltage operation may bring about a greater resistance variation problem than the current operation. This is because during voltage operation, when the memory cell is in a molten state, the resistance decreases, the current $$I = \frac{V}{R}$$

increases, and the power consumption $$P = \frac{V^2}{R}$$

doubles, which causes the memory cell to face problems of excessive amorphization, thermal breakdown, and thermal crosstalk due to heat accumulation. The effects of excessive crystallization, excessive amorphization, thermal breakdown, and thermal crosstalk are that the resistance variation from cycle to cycle may be large. This problem does not occur in current pulse operation. The voltage under current operation is V=IR, the resistance of the memory cell decreases, and the voltage V also decreases, which brings about the power consumption $P=IR^2$. The memory cell resistance is reduced and the power consumption is also reduced, so there is no problem of heat build-up. But in 3D PCM, a voltage pulse is required to be used to turn on the OTS strobe device.

Figure 2:
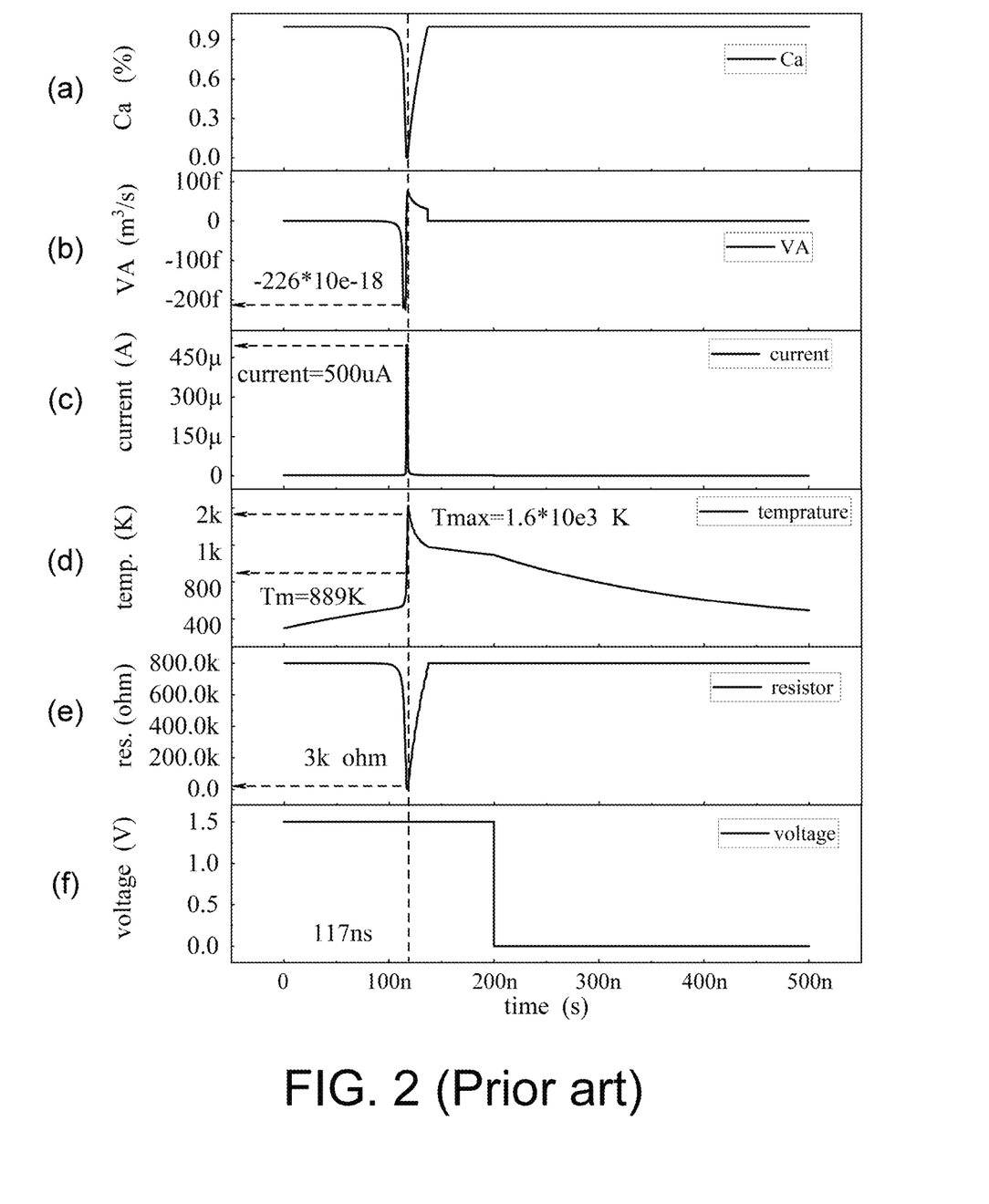
FIG. 2 is a simulation diagram of a voltage pulse operation in an embodiment of the disclosure.

FIG. 2 shows the problem brought by the conventional voltage pulse operation scheme to the set process. (f) in FIG. 2 is a set voltage pulse with an amplitude of 1.5V and a pulse width of 200 ns. As the resistance decreases during the set process, the current rises sharply. As shown in (c) in FIG. 2, a sharp rise in current will bring about a sharp rise in temperature. As shown in (d) in FIG. 2, when the temperature rises sharply to 700K to 800K, the crystallization rate is the fastest, resulting in a sharp increase in the crystallization ratio and a sharp decrease in the amorphization ratio. As shown in (a) in FIG. 2, a sharp reduction in the amorphization ratio results in a sharp reduction in resistance. As shown in (e) in FIG. 2, the decrease in resistance results in a sharp rise in current. The whole process forms a positive feedback, and the speed is extremely fast. Within 10 ns, the phase-change unit may be made to exceed the melting temperature Tm due to heat accumulation, resulting in amorphization of the phase-change unit, increased resistance, and unsuccessful set operation. In the process that occurs after 117 ns as shown in (b), (d), (a), and (e) in FIG. 2, at the time point of 117 ns, because the variation is not fixed, it cannot be solved by fixing the pulse width of the operating voltage.

In order to solve the above problems, the disclosure provides a read and write circuit of a three-dimensional phase-change memory including an operation control circuit 310 and a read and write operation circuit 320 connected to each other. The operation control circuit 310 is configured to load a correct operation pulse onto the read and write operation circuit 320 according to a read and write sequence operation requirement. The read and write operation circuit 320 includes a read and write unit, a bandgap reference source 321, a hysteresis comparator 322, and a feedback chopper circuit loop 323. The read-write unit is connected to a memory cell 324 and is configured to load the correct operation pulse into the memory cell 324 to operate the memory cell 324 and to mirror the correct operation pulse to a mirror current branch to obtain a mirror current. The bandgap reference source 321 and the hysteresis comparator 322 are connected to the mirror circuit branch, such that when a voltage obtained by the mirror current through a reference resistor is greater than a reference voltage in the bandgap reference source 321, the output of the hysteresis comparator 322 is a high level, otherwise it is a low level to represent a resistance state of the memory cell 324. The feedback chopper circuit loop 323 is connected across the memory cell 324 and the mirror circuit branch and is configured to monitor a current flowing through the memory cell 324 in the mirror circuit branch in real time. When the current is greater than a current threshold, the memory cell 324 is controlled to reduce the voltage, so that the temperature thereof cannot be accumulated for a short time, and thermal breakdown, unsuccessful set operation, and thermal crosstalk are prevented from occurring.

Figure 3:
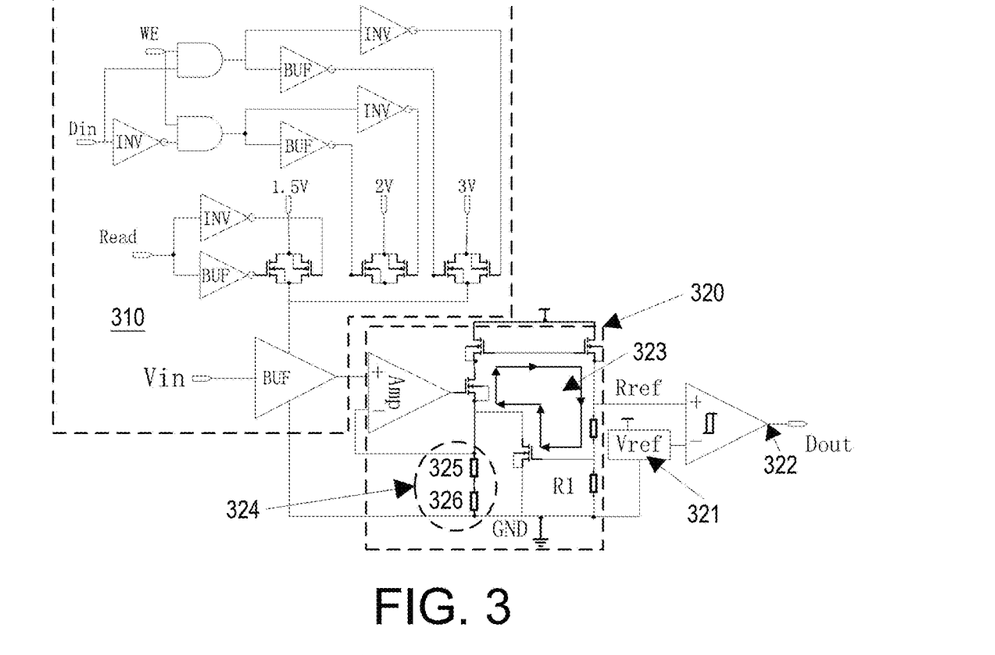
FIG. 3 is an overall structural diagram of a read and write circuit of a three-dimensional phase-change memory according to an embodiment of the disclosure.

FIG. 3 is the overall circuit diagram of the operation control circuit and the read and write operation circuit of the 3D phase-change memory. The operation control circuit 310 includes inverters INV, buffers BUF. The read and write operation circuit 320 includes an amplifier Amp and resisters R1 and Rref. The memory cell 234 includes an ovonic threshold switch (OTS) 325 and a phase-change memory (PCM) 326. Voltages Vref, GND, and a terminal Dout are also illustrated in FIG. 3. The circuits of FIG. 3 can complete the following functions. (1) An external control signal and a voltage operation pulse of a corresponding pulse width may be received, and then the pulse is boosted (stepped down) according to the logic level of the control signal to reach a corresponding amplitude of 1.5V, 2V, and 3V. (2) The circuit applies the operating voltage pulse to the memory cell 324 through a clamp amplifying circuit and performs read and write operations on the memory cell 324. The current flowing through the memory cell 324 is then mirrored to the output stage circuit and converted to a voltage through a reference resistor Rref, and the voltage is then compared with a voltage reference source. The comparator outputs "0" and "1" signals, which represent the high and low resistance information of the memory cell. (3) The circuit also avoids problems by cutting off the voltage pulse in time by the feedback chopping loop 323 to prevent excessive amorphization, thermal breakdown, and thermal crosstalk of the memory cell.

Figure 4:
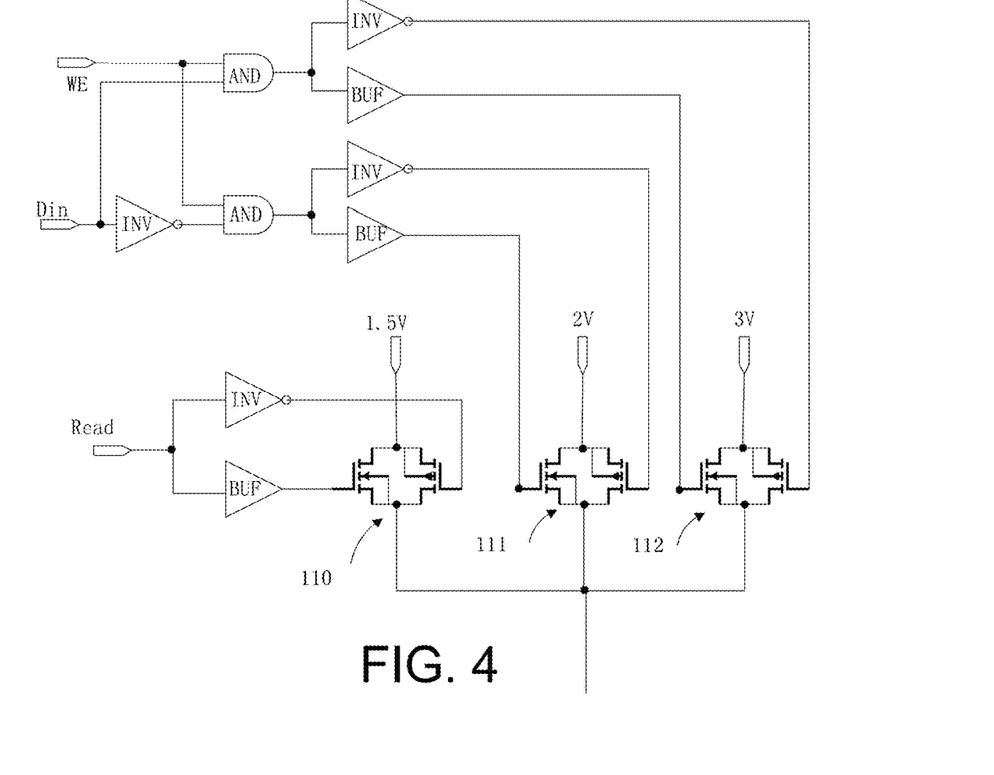
FIG. 4 is a structural diagram of an operation control circuit in an embodiment of the disclosure.

FIG. 4 is a structural diagram of part of an operation control circuit. Din represents the write data "0" and "1", WE is the write control signal enable. For example, when writing "0", WE=1 is enabled at high level, and the writing data Din=0, which means the reset operation is performed, "0" is written to the memory cell, the output logic turns on the 3V voltage, and the 3V voltage is applied to a power supply terminal of an input buffer to step down an input pulse. Similarly, WE=1 and Din=1 means writing "1", and the set operation will be performed on the memory cell. The output logic turns on 1.5V voltage and steps down the pulse signal on the input buffer to 1.5V. Read is the read enable signal, Read=1 represents the read enable, the output logic turns on the 2V voltage, and the 2V voltage is applied to the power supply terminal of the input buffer to step down the input pulse. Vin is the inputted operating voltage pulse signal and is provided by a counter of an external digital circuit. Vin determines the width of the input operating voltage pulse together with the control signal, the width being one of 50 ns, 100 ns, and 200 ns, but the amplitude is 3.3V. After passing through an input buffer 113, the amplitude of the input operating voltage pulse is stepped down to be one of 1.5V, 2V, and 3V.

As shown in FIG. 4, the circuit requires three power supply voltages, so the design of the read and write power supply input circuit needs to select the corresponding power supply according to the logic of the control circuit. Inverters INV, buffers BUF, and gates AND are illustrated in FIG. 4. The selection of the power supply operates through three transmission gates 110, 111, and 112. The NMOS transistors of the transmission gates 110-112 have the threshold voltage of 0.8V, and the three transmission gates 110-112 are connected to the voltages of 1.5V, 2V, and 3V, so that different voltages are selected to be connected to the voltage buffer.

Figure 5:
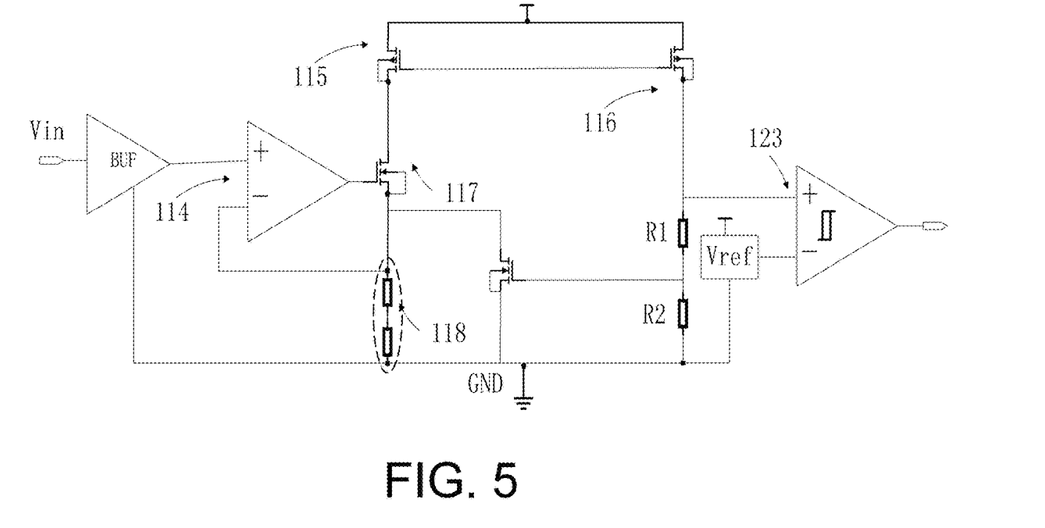
FIG. 5 is a structural diagram of a read and write operation circuit in an embodiment of the disclosure.

FIG. 5 is a read and write operation circuit. The clamp circuit consists of a Miller OTA operational amplifier 114 and an NMOS transistor 117. An input terminal of the operational amplifier 114 is connected to a buffer BUF. The gate of the NMOS transistor 117 is connected to the output of the operational amplifier 114, and the source is connected to the load impedance and the inverting terminal of the operational amplifier, and a current-voltage negative feedback loop is thereby formed. The non-inverting terminal input signal of the operational amplifier 114 is stably outputted from the source of the NMOS transistor 117. Read and write operations are thereby performed on the memory cell 118. The current through the memory cell 118 is mirrored to the reference resistor through PMOS mirror transistors 115 and 116. Resistors R1 and R2, and a voltage GND are illustrated. The generated voltage is compared with the voltage reference source Vref, and a "0" or "1" signal is outputted from the hysteresis comparator 123, representing the high and low resistance states of the memory cell. The output signal of the hysteresis comparator 123 enters the external data buffer to implement the read operation.

The right side of FIG. 5 shows the hysteresis comparator used in the circuit. Most memory chips use a sense amplifier when comparing voltages, which can quickly compare very small voltage differences, and the time required for a signal to go from input to output is about 1 ns to 5 ns. High sensitivity and high speed are thus provided. However, a more stable hysteresis comparator circuit is used in the disclosure. This is because the noise of the clock signal and the large leakage current exist in the analog-digital hybrid circuit, and there will be many glitches in the sense amplifier, which may lead to misreading. The use of a hysteresis comparator may enable a noise signal to be filtered out and misreading to be well eliminated, but at the cost of a delay of about 10 ns and the use of a transistor twice as large as the sense amplifier. The hysteresis window of the hysteresis comparator is designed to be 0.5V, which can filter out most of the noise, and the power supply voltage is 3.3V.

Figure 6:
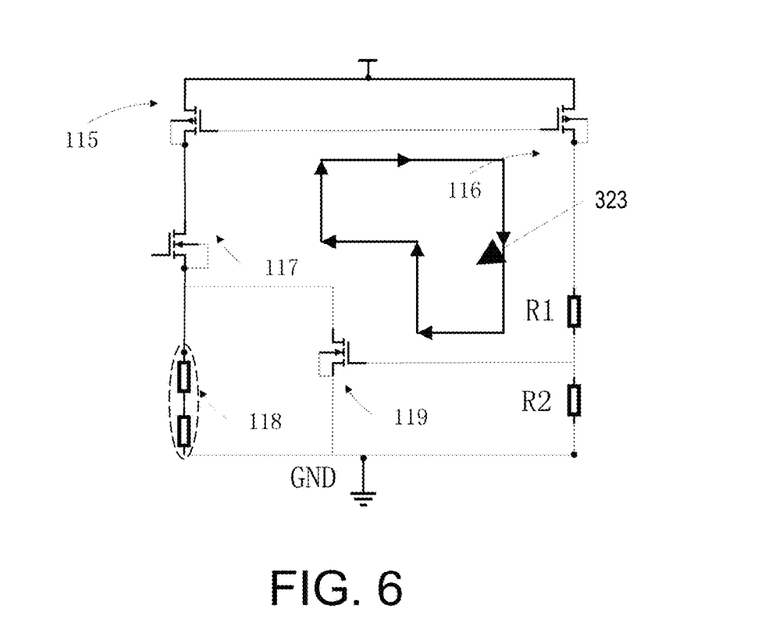
FIG. 6 is a structural diagram of a feedback chopper loop circuit according to an embodiment of the disclosure.

FIG. 6 is a circuit diagram of a feedback chopper loop. The purpose of introducing feedback chopping is to eliminate the excessive amorphization, thermal breakdown, and thermal crosstalk problems of the memory cell caused by the voltage pulse operation. During voltage pulse operation, consideration must be given to how to eliminate heat build-up. In the industry, the voltage is generally divided by connecting a resistor in series. When the current of the memory cell is excessively large, a suitable resistor is selected from the resistor array and is connected to the memory cell in series, and the resistor connected in series divides the voltage, and the voltage on the memory cell OTS+PCM is thereby reduced. The current is also reduced, and the problem of heat build-up is thereby eliminated. But this way of connecting resistors in series brings many problems. (1) It is not easy to implement on the circuit. The resistor connected in series is selected from the resistor array according to the magnitude of the current, and the entire process involves many complicated circuits. (2) The selection of the resistor to be connected in series is limited because large resistance may cause too much voltage is divided and the OTS may be turned off, but the problem of heat accumulation cannot be solved if small resistance is selected. (3) The process of selecting the resistor is not timely enough to adjust the current size in time.

Figure 7:
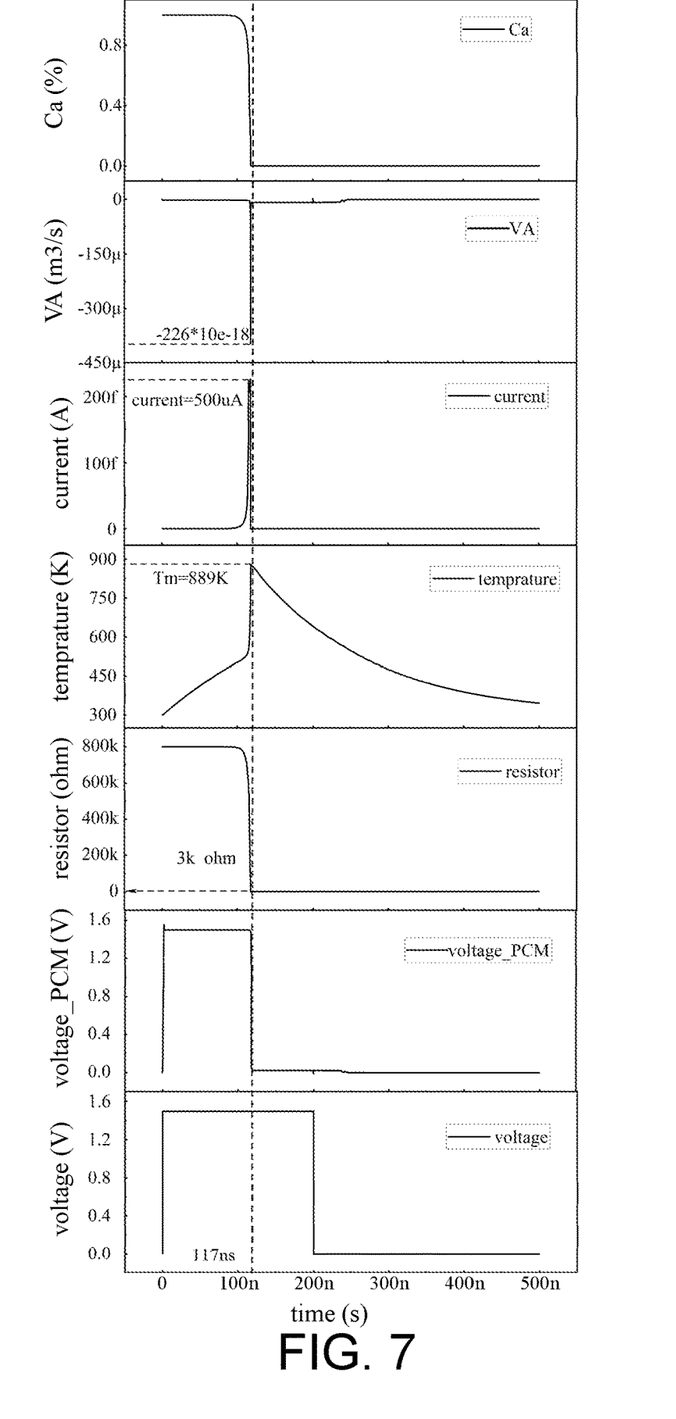
FIG. 7 is a diagram illustrating a simulation result of a feedback chopper circuit according to an embodiment of the disclosure.

Therefore, in the disclosure, a feedback loop is designed, and the feedback loop is shown in FIG. 6. After the current on the memory cell is sampled by the reference resistor, the turning-on state of a turning-on transistor is controlled. The equivalent on-resistance $$R_{on} = \frac{1}{k_n * (W/L) * V_{gs}}$$

of a shunt transistor 119 is turned on, W/L and kn are respectively the width-length ratio and the process parameter of the transistor. If the current of the memory cell is excessively large and greatly exceeds a predetermined value, the fed-back Vgs may increase accordingly, so that the shunt transistor is turned on and the voltage pulse is directly pulled to the ground. As can be seen from the final simulation result in FIG. 7, the set process changes from 800k ohm to 3k ohm in the high-resistance state. When it reaches 3k ohm, the current is the largest, and the set operation is successful. At this time, the voltage pulse is pulled to the ground by chopping, and the heat is not allowed to continue to be generated, and the problem of unsuccessful set operation is thus prevented from occurring. The reset process is also the same. When the phase-change region is fully molten, the resistance is consistent with complete crystallization and reaches 3k ohm. The current is the largest at this time, and the shunt transistor 119 controlled by the feedback resistor turns on the shunt, pulls the pulse to ground, quenches the phase-change unit, and resets to high resistance. Therefore, it is prevented that the pulse continues to be applied to the phase-change unit, which causes the temperature to continue to rise and the problems of excessive amorphization, thermal breakdown, and thermal crosstalk to occur.

Figure 8:
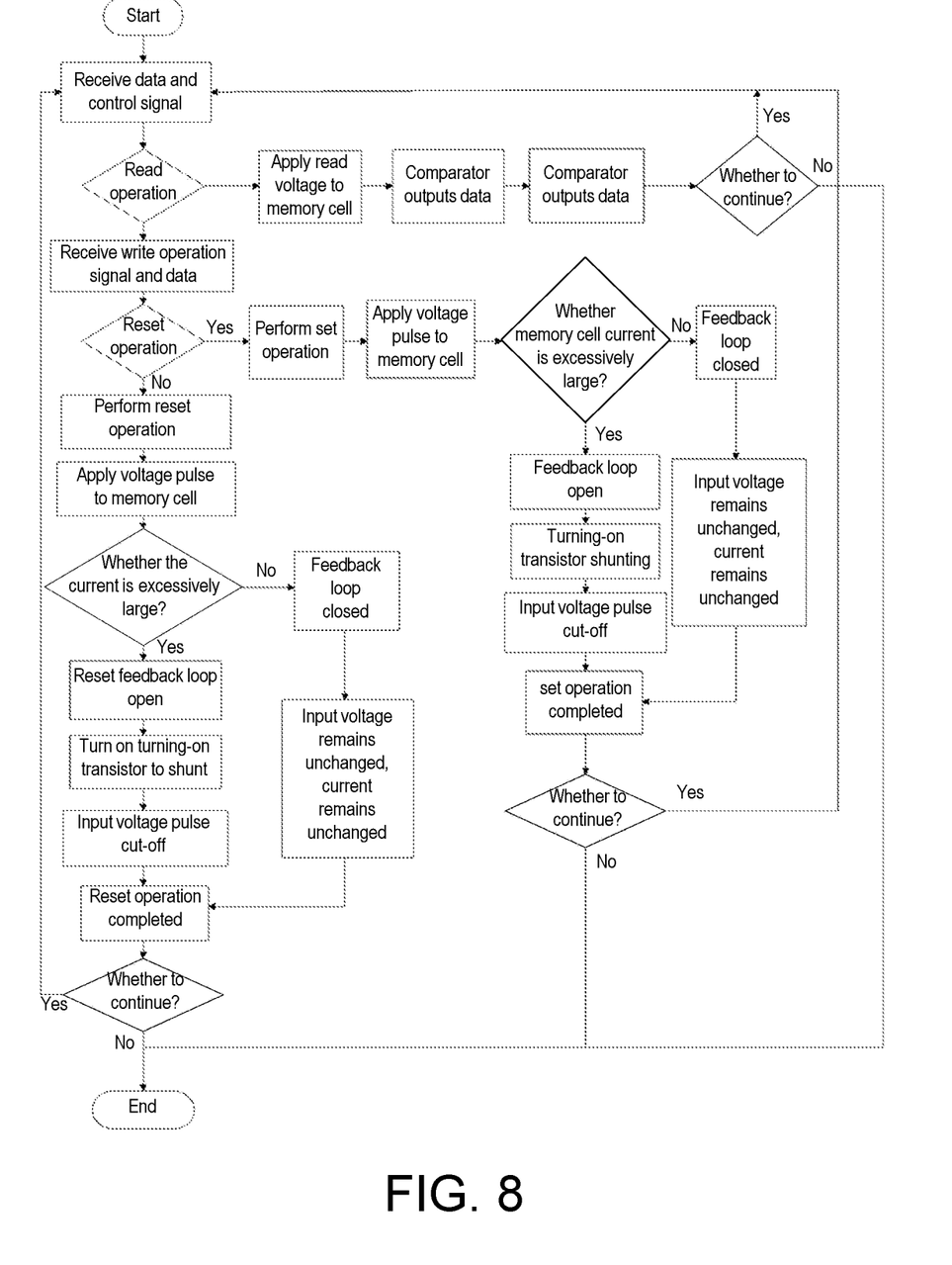
FIG. 8 is a functional logic diagram of the read and write circuit of the three-dimensional phase-change memory according to an embodiment of the disclosure.

FIG. 8 is a functional logic diagram of the read and write circuit of the three-dimensional phase-change memory, presenting the logic of the working behavior of the circuit under different conditions. In order to achieve the above purpose, the working process of the read and write circuit of the three-dimensional phase-change memory is provided as follows.

In step 1, the digital circuit accepts external read and write signals, address signals, and data signals and then generates corresponding control signals reset, set, and read to control the internal read and write operation circuit to perform corresponding operations on the memory cell. The generation of reading and writing operation voltage pulses is generated by the internal counter of the digital part according to the corresponding control signal logic to generate corresponding voltage pulses with different pulse widths. The amplitude of the voltage pulse generated at this time is the power supply voltage of 3.3V, so a pulse generation and control circuit is required to perform level shift conversion, and voltage pulses with different amplitudes of 1.5V, 2V, and 3V are thereby obtained.

In step 2, after receiving the control signal and the operating voltage pulse generated by the digital circuit part, the read and write operation circuit applies them to the memory cell and performs reset, set, and read operations on the memory cell. Finally, the memory cell information after the successful operation is outputted to an external data buffer through the comparator.

In step 3, the current on the memory cell is mirrored to the sampling resistor through the MOS tube mirror current method of the read and write operation circuit. The sampled voltage of the sampling resistor is returned to control the shunt transistor. When the current flowing through the phase-change unit is excessively large, the voltage sampled by the reference resistor may reach the threshold turning-on voltage of the shunt transistor, and the transistor is turned on to implement shunting, and the voltage on the phase-change unit is pulled down to close to 0V. The voltage pulse is thereby cut off to implement the pulse chop function. After chopping, the current of the memory cell is zero, so that the power consumption of the memory cell is reduced, the temperature may not rise sharply, and the problems of not being able to operate at low resistance during the set process and excessive amorphization, thermal breakdown, and thermal crosstalk during the reset process are prevented from occurring.

Further, there are three types of set, read, and reset voltages applied across the cell, which are Vset, Vread, and Vreset, respectively. Vset implements the set (write "1") operation of the phase-change unit, Vreset implements the reset (write "0") operation of the phase-change unit, and Vread implements the reading of the storage state of the phase-change unit.

A person having ordinary skills in the art should be able to easily understand that the above description is only preferred embodiments of the disclosure and is not intended to limit the disclosure. Any modifications, equivalent replacements, and modifications made without departing from the spirit and principles of the disclosure should fall within the protection scope of the disclosure.

What is claimed is:

1. A read and write circuit of a three-dimensional phase-change memory, comprising:
   an operation control circuit and a read and write operation circuit connected to each other,
   wherein the operation control circuit is configured to load a correct operation pulse onto the read and write operation circuit according to a read and write sequence operation requirement, and
   wherein the read and write operation circuit comprises:
   a read and write unit connected to a memory cell and configured to load the correct operation pulse onto the memory cell corresponding to the three-dimensional phase-change memory to operate the memory cell and to mirror the correct operation pulse to a mirror current branch to obtain a mirror current;
   a bandgap reference source and a hysteresis comparator connected to a mirror circuit branch, such that when a voltage obtained by the mirror current through a reference resistor is greater than a reference voltage in the bandgap reference source, the output of the hysteresis comparator is a high level, otherwise the output of the hysteresis comparator is a low level to represent a resistance state of the memory cell; and a feedback chopper circuit loop connected across the memory cell and the mirror circuit branch and configured to monitor a current flowing through the memory cell in real time, wherein when the current is greater than a current threshold, the memory cell is controlled to reduce the voltage obtained by the mirror current through the reference resistor, so that the temperature of the memory cell cannot be accumulated for a short time.

2. The read and write circuit of the three-dimensional phase-change memory according to claim 1, wherein the memory cell comprises a three-dimensional phase-change memory (PCM) and an ovonic threshold switch (OTS) strobe device connected in series.

3. The read and write circuit of the three-dimensional phase-change memory according to claim 1, wherein the feedback chopper circuit loop is further configured to feed back a sampling voltage obtained by the mirror current through a sampling resistor onto a feedback transistor, and if the sampling voltage is excessively large, the feedback transistor is turned on to pull a voltage of the correct operation pulse on the memory cell to a ground to cut off the voltage of the correct operation pulse, so that the temperature cannot be accumulated in a short time.

4. The read and write circuit of the three-dimensional phase-change memory according to claim 3, wherein the feedback transistor is an NMOS transistor and is connected in parallel with the memory cell, a gate of the NMOS transistor is connected to a resistor sampling terminal of the mirror current, such that the NMOS transistor is turned on and works in a linear resistance region when a sampled voltage is greater than a predetermined value, the NMOS transistor is regarded as an on-resistance far lower than the resistance of the memory cell to achieve current shunting, and an amplitude of an operating voltage pulse to the ground to chop a pulse waveform.

5. The read and write circuit of the three-dimensional phase-change memory according to claim 1, wherein the read and write unit is configured to perform reset, set, and read operations on the memory cell and output memory cell information after successful operation to an external data buffer through the comparator.

6. The read and write circuit of the three-dimensional phase-change memory according to claim 2, wherein the read and write unit is configured to perform reset, set, and read operations on the memory cell and output memory cell information after successful operation to an external data buffer through the comparator.

7. The read and write circuit of the three-dimensional phase-change memory according to claim 3, wherein the read and write unit is configured to perform reset, set, and read operations on the memory cell and output memory cell information after successful operation to an external data buffer through the comparator.

8. The read and write circuit of the three-dimensional phase-change memory according to claim 4, wherein the read and write unit is configured to perform reset, set, and read operations on the memory cell and output memory cell information after successful operation to an external data buffer through the comparator.

9. The read and write circuit of the three-dimensional phase-change memory according to claim 1, wherein the read and write operation circuit of the three-dimensional phase-change memory further comprises:
a pulse generation and control circuit connected to the operation control circuit and configured to convert externally-inputted operation signals with different pulse widths by performing level shift conversion to obtain the correct operation pulse and input the correct operation pulse to the operation control circuit.

10. The read and write circuit of the three-dimensional phase-change memory according to claim 2, wherein the read and write operation circuit of the three-dimensional phase-change memory further comprises:
a pulse generation and control circuit connected to the operation control circuit and configured to convert externally-inputted operation signals with different pulse widths by performing level shift conversion to obtain the correct operation pulse and input the correct operation pulse to the operation control circuit.

11. The read and write circuit of the three-dimensional phase-change memory according to claim 3, wherein the read and write operation circuit of the three-dimensional phase-change memory further comprises:
a pulse generation and control circuit connected to the operation control circuit and configured to convert externally-inputted operation signals with different pulse widths by performing level shift conversion to obtain the correct operation pulse and input the correct operation pulse to the operation control circuit.

12. The read and write circuit of the three-dimensional phase-change memory according to claim 4, wherein the read and write operation circuit of the three-dimensional phase-change memory further comprises:
a pulse generation and control circuit connected to the operation control circuit and configured to convert externally-inputted operation signals with different pulse widths by performing level shift conversion to obtain the correct operation pulse and input the correct operation pulse to the operation control circuit.

13. The read and write circuit of the three-dimensional phase-change memory according to claim 1, wherein the correct operation pulse is converted into voltage pulses of different amplitudes to 1.5 Volt (V), 2V, and 3V.

* * * * *